United States Patent [19]

Suzuki et al.

[11] Patent Number: 5,225,309
[45] Date of Patent: Jul. 6, 1993

[54] LIGHT-SENSITIVE LITHO PRINTING PLATE WITH CURED DIAZO PRIMER LAYER, DIAZO RESIN/SALT LIGHT-SENSITIVE LAYER CONTAINING A COUPLER AND SILICONE RUBBER OVERLAYER

[75] Inventors: Norihito Suzuki; Kiyoshi Goto, both of Hino; Hiroshi Tomiyasu, Tama; Kazuo Noguchi, Hino; Akeo Kasakura, Yokohama, all of Japan

[73] Assignees: Konica Corporation; Mitsubishi Kasei Corporation, both of Tokyo, Japan

[21] Appl. No.: 853,852

[22] Filed: Mar. 19, 1992

Related U.S. Application Data

[63] Continuation of Ser. No. 651,992, Feb. 7, 1991, abandoned.

[30] Foreign Application Priority Data

Feb. 8, 1990 [JP] Japan .................................. 2-29333
Jun. 7, 1990 [JP] Japan ................................ 2-147426

[51] Int. Cl.$^5$ ...................... G03F 7/016; G03F 7/021; G03F 7/095; G03F 7/105
[52] U.S. Cl. ..................................... 430/158; 430/145; 430/156; 430/162; 430/163; 430/171; 430/175; 430/180; 430/181; 430/182; 430/302; 430/303
[58] Field of Search ............... 430/145, 156, 162, 302, 430/303, 158, 163, 171, 175, 180, 181, 182

[56] References Cited

U.S. PATENT DOCUMENTS

| | | |
|---|---|---|
| 3,373,021 | 3/1968 | Adams et al. .................... 430/162 |
| 3,890,149 | 6/1975 | Schlesinger et al. ............... 430/162 |
| 3,953,212 | 4/1976 | Miyano et al. .................... 430/303 |
| 4,511,642 | 4/1985 | Higashi et al. .................... 430/162 |
| 4,826,752 | 5/1989 | Yoshida et al. .................... 430/162 |
| 4,828,957 | 5/1989 | Yonese et al. ..................... 430/162 |
| 4,842,988 | 6/1989 | Herrmann et al. ................. 430/162 |
| 4,937,169 | 6/1990 | Schlosser .......................... 430/162 |
| 4,956,262 | 9/1990 | Schlosser et al. .................. 430/162 |

FOREIGN PATENT DOCUMENTS 0154980 9/1985 European Pat. Off. .
0426470A2 5/1991 European Pat. Off. .

OTHER PUBLICATIONS

Kimoto K.K., Patent Abstracts of Japan, vol. 5, No. 173 (P-87) (845), Aug. 13, 1981 for JP-A-56 101 141.
Nippon Kankoushi Kogyo K.K., Patent Abstracts of Japan, vol. 5, No. 196 (P-93) (868), Sep. 18, 1981 for JP-A-56 119 130.
European Search Report dated Apr. 14, 1992 for Application No. EP-91 30 1026 and Annex.

*Primary Examiner*—Charles L. Bowers, Jr.
*Assistant Examiner*—Christopher G. Young
*Attorney, Agent, or Firm*—Finnegan, Henderson, Farabow, Garrett & Dunner

[57] ABSTRACT

Disclosed is a light-sensitive litho printing plate comprising:
a support, a light-sensitive layer and a silicone rubber layer provided thereon,
wherein said light-sensitive layer contains a substance, whereby said substance forms a color during developing or after developing.

10 Claims, No Drawings

LIGHT-SENSITIVE LITHO PRINTING PLATE WITH CURED DIAZO PRIMER LAYER, DIAZO RESIN/SALT LIGHT-SENSITIVE LAYER CONTAINING A COUPLER AND SILICONE RUBBER OVERLAYER

This application is a continuation of application Ser. No. 07/651,992 filed Feb. 7, 1991, now abandoned.

BACKGROUND OF THE INVENTION

This invention relates to a light-sensitive litho printing plate, more particularly to a light-sensitive litho printing plate which can give a printing plate requiring no dampening water with a sharp image after developing, and further will not contaminate hands or clothings after developing, etc.

In the prior art, as the light-sensitive litho printing plate (hereinafter called "plate material" if necessary) requiring no dampening water, one having a light-sensitive layer and an ink repellent layer provided successively by coating on a support has been known. By subjecting the plate material to exposure and developing, a litho printing plate (hereinafter called "printing plate" if necessary) can be obtained.

Such plate materials include those which dissolve the unexposed portion (image portion) of the light-sensitive material by use of a developer and remove the silicone rubber layer of the upper layer accompanied therewith as described in Japanese Patent Publication No. 22781/1980, and those which adhere the exposed portion (non-image portion) firmly to the light-sensitive layer by photoadhesion and remove only the silicon rubber layer at the unexposed portion (image portion) by swelling it with an organic solvent as disclosed in Japanese Unexamined Patent Publication No. 26923/1979.

Among them, those of the type which remove only the silicone rubber at the unexposed portion (image portion) by swelling it with an organic solvent involve the problem that, when the image is observed after developing, it can be seen very difficultly, because only the silicone rubber layer is removed by developing.

Those which have solved this problem are disclosed in, for example, Japanese Unexamined Patent Publications Nos. 103103/1979, 133153/1988, etc., in which it is specifically disclosed to dye the light-sensitive layer or the primer layer exposed after developing with a dye, but these involve the undesirable problems on account of use of a dying solution such that the hands or clothings are contaminated with a dyeing solution remaining on the printing plate surface, or that the automatic developing machine is contaminated with a dyeing solution.

Accordingly, the present inventors have continued intensively studies in order to improve the above-mentioned problems, and consequently found that not only a printing plate with a sharp image can be obtained, but also hands or clothings will not be contaminated with a dyeing solution, or the automatic developing machine will not be contaminated, by incorporating a substance which forms color through the reaction with a component in the processing solution into the light-sensitive layer, to accomplish the present invention.

Therefore, an object of the present invention is to provide a light-sensitive litho printing plate requiring no dampening water which can give a printing plate requiring no dampening water with a sharp image after developing, and further will not contaminate hands or clothings, or contaminate an automatic developing machine with a dyeing solution after developing, etc.

SUMMARY OF THE INVENTION

The above-mentioned object of the present invention has been accomplished by a light-sensitive litho printing plate comprising: a support, a light-sensitive layer and a silicone rubber layer provided thereon, wherein said light-sensitive layer contains a substance, whereby said substance forms a color during developing or after developing.

DETAILED DESCRIPTION OF THE INVENTION

In the present invention, the specific feature resides in incorporating a substance which forms a color simultaneously with developing or in the processing after developing into the light-sensitive layer of the light-sensitive litho printing plate requiring no dampening water. More specifically, this embodiment includes the case when a color forming substance is contained in the light-sensitive layer and a substance which forms a color through the reaction with the color forming substance, namely a coupler, is contained in the developer or a processing solution after developing, and the case when a color forming substance and a coupler are contained in the light-sensitive layer.

In the latter case, the color forming substance reacts with the coupler through the catalytic action of a substance in the processing solution to form a dye and effect color formation.

Preferably, the color forming substance contained in the light-sensitive layer should be preferably a light-sensitive substance, more preferably said light-sensitive substance should undergo photochemical reaction by exposure to be composed or denatured, whereby it will lose the ability to react with the component (coupler) in the processing solution or the light-sensitive layer and hence effect no color formation. In this case, the light-sensitive layer remaining on the non-image line portion has lost the ability to effect color formation, and therefore no color formation will occur even if the processing solution may be penetrated through the silicone rubber existing thereon.

Hence, the printing plate can be particularly advantageously enlarged in contrast between the image line portion and the non-image line portion.

The above-mentioned processing solution means either a developer or a solution for processing the litho printing plate after developing. As the substance which forms a color through the reaction with a coupler, there may be included, for example, diazo resins such as hydrochlorides of diazo compounds, tetrafluoroboric acids, hexafluorophosphoric acids, zinc chloride complexes, etc., as exemplified by the specific compounds shown below:

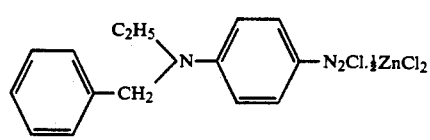

1.

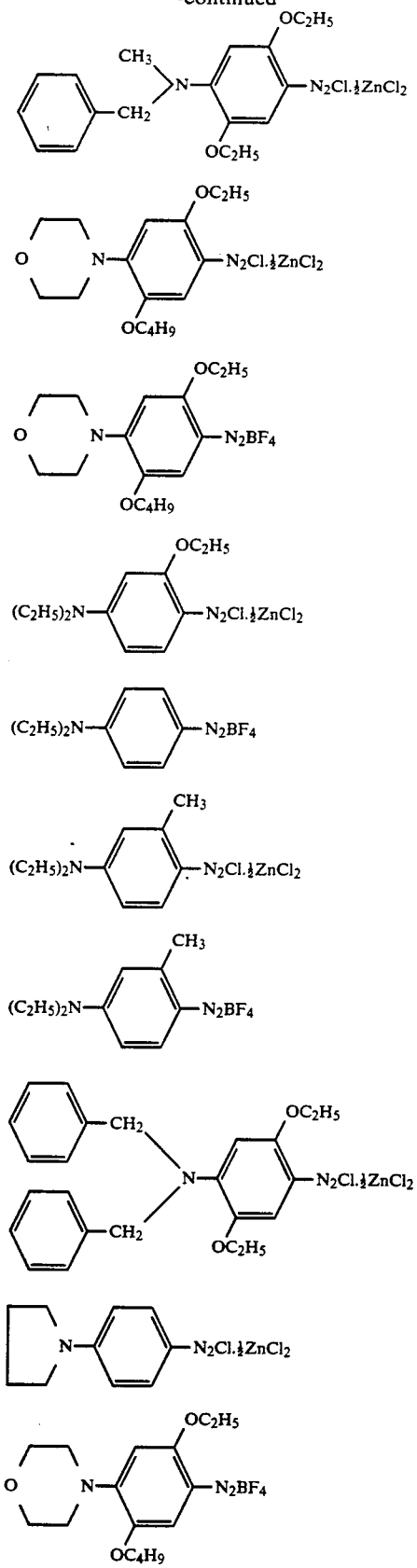

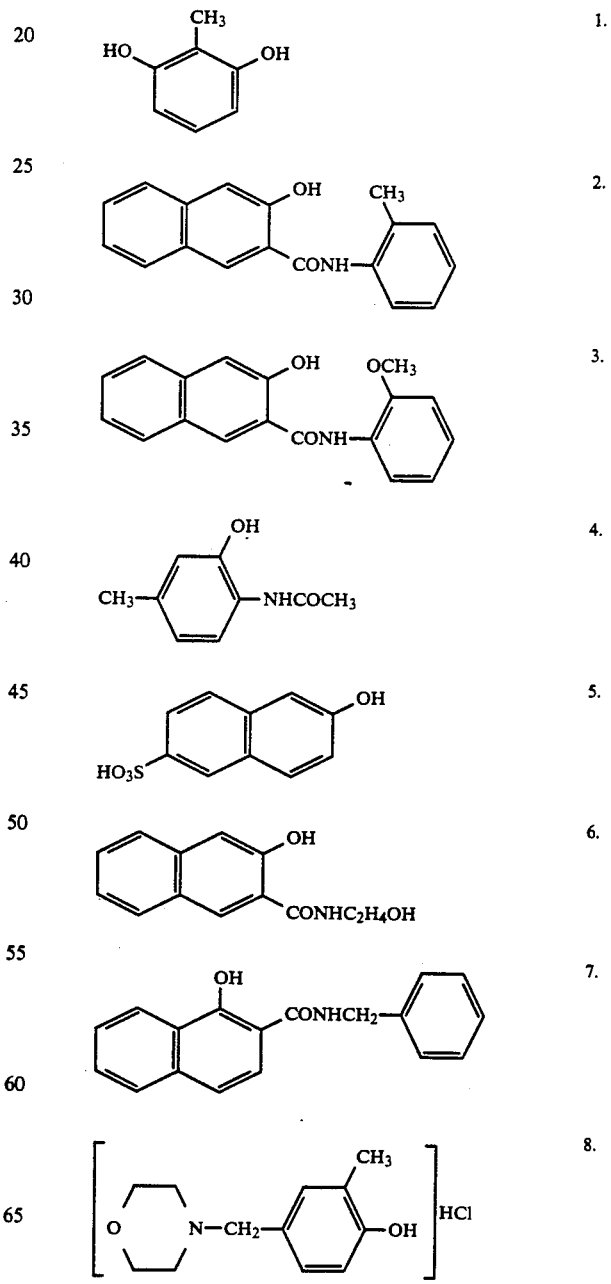

70% by weight, in the solids of the light-sensitive composition.

The content of these diazo compounds may be 5 to 45% by weight, preferably 10 to 30% by weight.

In the above-mentioned processing solution and/or the light-sensitive layer, a substances which forms a dye through the reaction with the color forming substance existing in the light-sensitive layer, namely a coupler, and said coupler may include acylacetanilides, 1,3-substituted pyrazolones, phenols, naphthols, etc.

Specific compounds may include, for example, β-naphthol, 1-phenyl-3-methyl-5-pyrazolone, 1,5-dihydroxynaphthalene, or otherwise the couplers shown below.

The content of these diazo resins may be 10% by weight to 90% by weight, preferably 30% by weight to -continued 9. 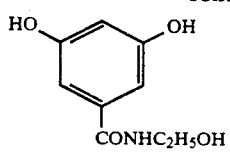

10. 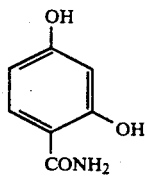

11. 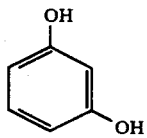

12. 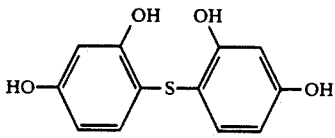

13. 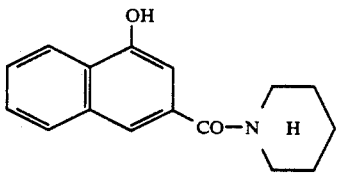

The content of these couplers, when incorporated in the processing solution, may be 0.1% by weight to 20% by weight, preferably 1% by weight to 10% by weight, based on the processing solution.

When a coupler is incorporated in the light-sensitive layer, it may be contained in an amount of 0.2% by weight to 40% by weight, preferably 1% by weight to 30% by weight, in the solids of the light-sensitive composition.

In the present invention, after exposure of the light-sensitive litho printing plate requiring no dampening water having a substance which forms a color simultaneously with developing or processing after developing incorporated in the above-described light-sensitive layer, by effecting color formation simultaneously with developing or processing with a processing solution when processed with the processing solution after developing, a printing plate excellent in layout proof can be obtained.

When the processing solution contains a coupler, it contains, in addition to the above-described coupler, an organic solvent which dissolves the coupler, water, a surfactant, an alkali agent which has the catalytic action for the reaction between the color forming substance and the coupler.

When the light-sensitive layer contains a coupler, it contains an organic solvent, water, a surfactant, an alkali agent, etc. In this case, because no coupler is required to be dispersed or dissolved in the processing solution, the amounts of the organic solvent, the surfactant used can be made smaller, whereby advantageous effects can be preferably obtained in aspects of working environment, waste solution disposal of the processing solution.

The processing solution containing a substance reactive with the color forming substance existing in the light-sensitive layer or a coupler or having the catalytic action for reaction with the color forming substance in the light-sensitive layer may be either the same as or different from the developer, but should be preferably the same as the developer, because it is more preferable that color formation can be preferably effected simultaneously with developing.

As the silicone rubber layer to be used in the present invention, one composed mainly of a linear organic polysiloxane having hydroxyl groups in the main chain having the repeating units shown by the following formula [I] and a molecular weight of some 1000 to some 100,000 or at the ends of the main chain is preferred.

   Formula [I]

Here, n is an integer of 2 or more, R an alkyl group having 1 to 10 carbon atoms, a halogenated alkyl group, an alkoxyl group, a vinyl group, an aryl group, a silanol group (OH group), with 60% or more of R being preferably methyl groups. The above-mentioned silanol group (OH group) may be either in the main chain or at the ends of the main chain, but preferably at the ends of the main chain.

The silane coupling agent (or silicone crosslinking agent) to be used in the present invention may be a silane compound represented by the formula:

(wherein n is an integer of 1 to 3, R represents a monovalent group such as alkyl, aryl, alkenyl or a combination of these, and these groups may also have functional groups such as halogen, amine, hydroxy, alkoxy, aryloxy, thiol, etc. X represents a substituent such as —OH, —OR$^2$, —OAc,

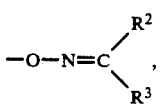

—Cl, —Br, —I, etc. Here, R$^2$, R$^3$ represent the same as the above R, and R$^2$, R$^3$ may be either the same or different. Ac represents acetyl group).

Useful silicone rubbers in the present invention are those obtained by the condensation reaction between such silicone base polymers and the silicone crosslinking agent as described above.

Specific examples of the silane coupling agent to be used in the present invention may include HN[(CH$_2$)$_3$Si(OMe)$_3$]$_2$, vinyltriethoxysilane, Cl(CH$_2$)$_3$Si(OMe)$_3$, CH$_3$Si(OAc)$_3$, HS(CH$_2$)$_3$Si(OMe)$_3$, vinyltris(methyl ethyl ketoxime)silane, etc.

The above-mentioned silicone rubber is also available as commercial product, including, for example, YE-3085 manufactured by Toshiba Silicone. Other useful silicone rubbers can be also obtained by the reaction of the base polymer as described above with the silicone oil having the repeating units represented by the following formula [II], or by the addition reaction with a base polymer of silicone of which about 3% of R are vinyl groups, or the reaction mutually between said silicone oils.

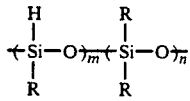

Formula [II]

(wherein R has the same meaning as R which is the substituent in the polymer represented by the formula [I], m is an integer of 2 or more, and n an integer of 0 or 1 or more).

For obtaining the silicone rubber by such crosslinking reaction, the crosslinking reaction is carried out by use of a catalyst. As such catalyst, there may be employed organic carboxylic acid salts of metals such as tin, zinc, cobalt, lead, calcium, manganese, etc., as exemplified by dibutyltin laurate, tin (II) octoate, cobalt naphthenate, etc. or chloroplatinic acid, etc.

For the purpose of obtaining a silicone rubber which can stand the frictional force occurring during the printing operation by improving the strength of silicone rubber, filler can be also mixed therein. Silicone rubbers previously mixed with fillers are commercially available as silicone rubber stocks or silicone rubber dispersions, and when it is desirable to obtain a silicone rubber film by coating as in the present invention, a dispersion of RTV or LTV silicone rubber may be preferably employed. Examples of such dispersions may include silicone rubber dispersions for paper coating such as Syl Off 23, SRX-257, SH237, etc.

In the present invention, it is preferable to employ a silicone rubber of the condensation crosslinked type.

In the silicone rubber layer, for further improvement of adhesion, a silane coupling agent having amino groups may be preferably contained.

Examples of preferable silane coupling agents may include the following:
(a) $H_2NCH_2CH_2NH(CH_2)_3Si(OCH_3)_3$
(b) $H_2NCE_2CH_2NH(CH_2)_3Si(OCH_3)_2(CH_3)$
(c) $H_2(CH_2)_3Si(OEt)_3$ In the silicone rubber layer to be used in the present invention, a small amount of a photosensitizer can be further contained.

The silicone rubber layer of the present invention can be prepared by dissolving a silicone rubber in an appropriate solvent, then coated on the light-sensitive layer and dried.

As the light-sensitive composition to be used in the present invention, any of known light-sensitive compositions can be used, but preferably a diazo resin and a photopolymerizable compound may be used, particularly preferably a diazo resin which can function also as the substance which forms a color through the reaction with the component (coupler) in the processing solution and/or the light-sensitive layer.

In the following, the light-sensitive composition is described in detail.

(1) Light-sensitive composition containing diazo resin:

The diazo resin to be used in the present invention includes various resins, but preferably, a diazo resin as represented by the condensate between p-diazodiphenylamine and formaldehyde, which is insoluble in water and soluble in an organic solvent, preferably one insoluble in water and soluble in conventional organic solvents as described in Japanese Patent Publications Nos. 1167/1972 and 43890/1982. Particularly preferably, a diazo resin represented by the following formula [III] may be employed.

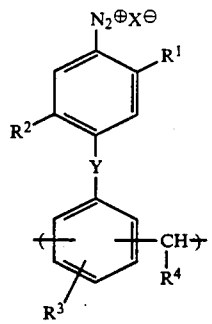

Formula [III]

[wherein $R^1$, $R^2$ and $R^3$ represent hydrogen atom, an alkyl group or an alkoxy group, $R^4$ hydrogen atom, an alkyl group or a phenyl group. X represents an anion, and Y —NH—, —S— or —O—].

As the diazo monomer in the diazo resin to be used in the present invention, the diazo compounds as mentioned above can be used, and preferable examples may include 4-diazodiephenylamine, 3-methoxy-4-diazodiphenylamine, 3-ethoxy-4-diazodiphenylamine.

As the aldehyde to be used as the condensing agent with the above-mentioned diazo monomer, for example, there may be included formaldehyde, acetaldehyde, propionaldehyde, butylaldehyde, isobutylaldehyde, or benzaldehyde, etc.

Further, as the anion, a water-soluble diazo resin can be obtained by use of chloride ions or tetrachlorozinc acid, etc., or alternatively a diazo resin soluble in an organic solvent can be obtained by use of boron tetrafluoride, hexafluorophosphoric acid, triisopropylnaphthalenesulfonic acid, 4,4'-biphenyldisulfonic acid, 2,5-dimethylbenzenesulfonic acid, 2-nitrobenzenesulfonic acid, 2-methoxy-4-hydroxy-5-benzoyl-benzenesulfonic acid, etc. Particularly preferably, a diazo resin comprising hexafluorophosphoric acid may be employed.

The diazo resin should be preferably employed as a mixture with a film forming resin (binder), particularly a lipophilic polymeric compound having hydroxyl groups. As such lipophilic polymeric compound, there may be included monomers having aliphatic hydroxyl groups in the side chain, such as 2-hydroxyethyl acrylate or a copolymer of 2-hydroxyethyl methacrylate and other monomers copolymerizable therewith. Other than these if necessary, polyvinylbutyral resin, polyurethane resin, polyamide resin, epoxy resin, novolac resin, other natural resins, etc. may be also added.

Otherwise, as the binder to be used in combination with the diazonium salt, various polymeric compounds can be used, preferably copolymers of the monomers having aromatic hydroxyl groups such as N-(4-hydroxyphenyl)acrylamide, N-(4hydroxyphenyl)methacrylamide, o-, m- or p-hydroxystryene, o-, m- or p-hydroxyphenyl methacrylate as described in Japanese Unexamined Patent Publication No. 98613/1979; polymers containing hydroxyethyl acrylate units or hydroxyethyl methacrylate units as the main repeating units as described in U.S. Pat. No. 4,123,276; natural resins such as shellac, rosin, etc.; polyvinyl alcohol; polyamide resins as described in U.S. Pat. No. 3,751,757; linear polyurethane resins, phthalated resins of polyvinyl alcohol, epoxy resins condensed from bisphenol A and epichlorohydrin, as described in U.S. Pat. No. 3,660,097; and as the alkali-soluble resins, novolac resins, vinyl type polymers having phenolic hydroxyl groups, condensed resins of polyvalent phenol and aldehyde or ketone as described in Japanese Unexamined Patent Publication No. 57841/1980; and so on. Examples of novolac resins may include phenol-formaldehyde resins, cresol-formaldehyde resin, phenol-cresol-formaldehyde copolycondensed resins, copolycondensed resins of p-substituted phenol with phenol, or cresol and formaldehyde.

These binders may be contained in amounts of 10 to 95% by weight, preferably 40 to 80% by weight, in the solids of the light-sensitive composition. On the other hand, the diazo resin may be contained in an amount of 5 to 80% by weight, preferably 15 to 60% by weight.

(2) Light-sensitive composition containing a polymeric compound having

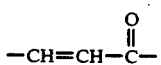

group in the main chain or the side chain:

As such polymeric compounds, there may be included those composed mainly of light-sensitive polymers such as polyesters, polyamides, polycarbonates containing

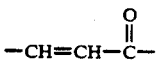

as the light-sensitive group in the main chain or the side chain of the polymer (e.g. compounds as described in U.S. Pat. Nos. 3,030,208, 3,707,373 and 3,453,237); those composed mainly of light-sensitive polyesters derived from (2-propelidene)malonic acid compounds such as cinnamylidene malonic acid, etc. and bifunctional glycols (e.g. light-sensitive polymers as disclosed in U.S. Pat. Nos. 2,956,878 and 3,173,787); cinnamic acid esters of hydroxyl containing polymers such as polyvinyl alcohol, starch cellulose and analogues thereof (e.g. light-sensitive polymers as described in U.S. Pat. Nos. 2,690,966, 2,752,372, 2,732,301, etc.); and so on.

(3) Photopolymerizable composition comprising addition polymerizable unsaturated compound:

The composition comprises, preferably, (a) a vinyl monomer having at least 2 terminal vinyl groups, (b) a photopolymerization initiator and (c) a polymeric compound as the binder.

The vinyl monomers of the component (a) are described in Japanese Patent Publication Nos. 5093/1960, 14719/1960, 28727/1969. There may be included acrylates or methacrylates of polyols, namely diethylene glycol di(meth)acrylate, triethylene glycol di(meth)acrylate, pentaerythritol tri(meth)acryalte, trimethylolpropane tri(meth)acryalte and the like, or (meth)acrylamides such as methylenebis (meth)acrylamide, ethylene bis (meth) acrylamide and the like, or unsaturated monomers containing urethane groups, for example, reaction products of diol mono(meth)acrylates such as di-(2'-methacryloxyethyl)-2,4-toluylenediurethane, di-(2'-acryloxyethyl)trimethylenediruethane and the like.

As the photopolymerization initiator of the above component (b), there are carbonyl compounds, organic sulfur compounds, persulfates, redox type compounds, azo and diazo compounds, halogenic compounds, photoreducible dyes, etc. as described in "Light-sensitive Systems" written by J. Kosar, Chap. 5. More specifically, they are disclosed in U.K. Patent No. 1,459,563.

Further, as the binder of the component (c), various known polymers can be employed. Details of specific binders are described in U.S. Pat. No. 4,072,527.

The amounts of additives to be added optionally in the above-mentioned light-sensitive composition such as ink receptive agents, surfactants, sensitizers, stabilizers, thermal polymerization inhibitors, plasticizers, dyes, pigments, etc. depend on the kinds, but may be generally 0.01 to 20% by weight, preferably 0.05 to 10% by weight, based on the light-sensitive composition contained in the light-sensitive coating solution.

The support to be used for the plate material of the present invention should be preferably one which can set bending characteristic capable of being set on a conventional litho printing machine and the load applied during printing. For example, there may be included metal plates such as of aluminum, zinc, copper, steel, etc., and metal plates having chromium, zinc, copper, nickel, aluminum and iron, etc. plated or vapor deposited thereon, papers, plastic films and glass plates, resin coated papers, papers having metal foils such as of aluminum, etc. laminated thereon.

Among them, preferable is an aluminum plate.

The treatment on the support itself for improvement of adhesion as mentioned above is not particularly limited, but various surface roughening treatments may be included.

Before coating the support with the light-sensitive layer, for obtaining sufficient adhesion between the light-sensitive layer and the support, a primer layer may be also provided on the support, and said primer layer may include, for example, polyester resin, vinyl chloride-vinyl acetate copolymer, acrylic resin, vinyl chloride resin, polyamide resin, polyvinyl butyral resin, epoxy resin, acrylate type copolymer, vinyl acetate type copolymer, phenoxy resin, polyurethane resin, polycarbonate resin, polyacrylonitrile butadiene, polyvinyl acetate, etc.

As the anchor agent constituting the above-mentioned primer layer, for example, silane coupling agents, organic titanates, etc. are also effective.

The thicknesses of the respective layers constituting the plate material of the present invention are as described below. That is, the support has a thickness of 50 to 1000 μm, preferably 100 to 300 μm, the light-sensitive layer 0.05 to 10 μm, preferably 0.5 to 5.0 μm, the silicone rubber layer 0.5 to 100 μm, preferably 1 to 4 μm.

In the present invention, the silicone rubber layer may also have a protective layer on its upper surface, if desired.

The plate material requiring no dampening water may be prepared, for example, as described below.

On a support, a composition solution to constitute the light-sensitive layer is coated and dried by use of a conventional coater such as reverse roll coater, air knife coater, Meyer bar coater, etc, or a rotary coating device such as wheeler.

If necessary, a primer layer can be provided between the support and the light-sensitive layer in the same manner as in provision of said light-sensitive layer and cured by heating or exposure, followed by coating and drying of the light-sensitive layer, and further a silicone rubber solution can be coated according to the same method on the light-sensitive layer and heated generally at a temperature of 100° to 120° C. for several minutes to be sufficiently cured, thereby forming a silicone rubber layer. If necessary, a protective film can be formed on said silicone rubber layer by means of a laminator.

Next, the method for preparing the printing plate requiring no dampening water by use of the plate material requiring no dampening water of the present invention is described.

The positive film which is an original manuscript is vacuum adhered on the surface of a posi-type plate material and subjected to exposure. For the light source for this exposure, there may be employed mercury lamp, carbon arc lamp, xenon lamp, metal halide lamp, fluorescent lamp, etc. which generate abundantly UV-ray.

Next, the positive film is peeled off and developed with a developer. As the developer, those known in the art as the developer for the plate material requiring no dampening water can be utilized, preferably an aqueous developer.

The aqueous developer can include developers containing 30% by weight or more, preferably 50% by weight to 98% by weight, of water and an organic solvent, a surfactant, and further preferably containing an alkali agent.

More preferably, a substance reactive with the above-mentioned color forming substance or the above-mentioned coupler is contained so that the color forming substance existing in the light-sensitive layer can form a color simultaneously with developing.

As the organic solvent contained in the developer comprising water as the main component, there may be included, for example, aliphatic hydrocarbons (hexane, heptane, "Isopar E, H, G" (Esso Chemical, trade names of aliphatic hydrocarbons) or gasoline, kerosene, etc.), aromatic hydrocarbons (toluene, xylene, etc.), or halogenated hydrocarbons (Triclene, etc.), alcohols (methanol, ethanol, 1-butoxy-2-propanol, 3-methyl-3-methoxybutanol, benzyl alcohol, etc.), ethers (methyl cellosolve, ethyl cellosolve, butyl cellosolve, phenyl cellosolve, methyl carbitol, ethyl carbitol, butyl carbitol, dioxane, diethylene glycol dimethyl ether, diethylene glycol diethyl ether, diethylene glycol dibutyl ether, ethylene glycol dibutyl ether, propylene glycol, dipropylene glycol butyl ether, tripropylene glycol methyl ether, polypropylene glycol methyl ether, etc.), ketones (acetone, methyl ethyl ketone, methyl isobutyl ketone, diisobutyl ketone, 4-methyl-1,3-dioxorane-2-one, etc.), esters (ethyl acetate, propyl acetate, hexyl acetate, methyl butyrate, propyl butyrate, diethyl succinate, dibutyl oxalate, diethyl maleate, benzyl benzoate, methyl cellosolve acetate, cellosolve acetate, carbitol acetate, etc.), and so on.

As the surfactant to be added in the developer of the present invention, there may be included anionic surfactants, nonionic surfactants, cationic surfactants and amphoteric surfactants, specifically those as set forth below:

(1) Higher alcohol sulfates (e.g. sodium salt of lauryl alcohol sulfate, ammonium salt of octylalcohol sulfate, ammonium salt of lauryl alcohol sulfate, secondary sodium alkyl sulfate, etc.);

(2) Aliphatic alcohol phosphate salts (e.g. sodium salt of cetyl alcohol phosphate, etc.);

(3) Alkylaryl sulfonic acid salts (e.g. sodium dodecylbenzenesulfonate, sodium isopropylnaphthalenesulfonate, sodium dinaphthalenesulfonate, sodium metadinitrobenzenesulfonate, etc.);

(4) Alkylamidesulfonic acid salts:

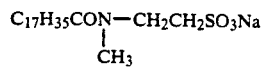

(5) Sulfonic acid salts of dibasic fatty esters (e.g. sodium dioctyl sulfosuccinate, sodium dihexyl sulfonsuccinate, etc.);

(6) formaldehyde condensate of alkylnaphthalenesulfonic acid salts (e.g. formaldehyde condensate of sodium dibutylnaphthalenesulfonate).

As the nonionic surfactant, there may be included polyoxyethylene alkyl ethers, polyoxyethylene alkyl phenol ethers, polyethylene fatty acid esters, sorbitane fatty acid esters, polyoxyethylene sorbitane fatty acid esters, glycerine fatty acid esters, oxyethylene oxypropylene block polymers, etc.

As the cationic surfactant, alkylamine salts, quaternary ammonium salts, polyoxyethylene alkylamines, etc. may be included.

As the amphoteric surfactant, alkyl betains may be included, and among these, anionic surfactants are suitable.

These surfactants can be used either singly or as a combination of two or more kinds.

The amount of the surfactant to be used in the present invention may be suitably 0.01% by weight to 60% by weight, preferably 0.1% by weight to 10% by weight.

Further, as the alkali agent to be used in the present invention there may be included:

(1) inorganic alkali agents such as sodium silicate, potassium silicate, potassium hydroxide, sodium hydroxide, lithium hydroxide, secondary or tertiary sodium or ammonium phosphate, sodium metasilicate, sodium carbonate, ammonia, etc.;

(2) organic amine compounds such as mono-, di or trimethylamine, mono-, di or triethylamine, mono- or diisopropylamine, n-butylamine, mono, di- or triethanolamine, mono-, di- or triisopropanolamine, ethylenimine, ethylenediimine, etc.

The alkali agent used may be suitably 0.05% by weight to 20% by weight, preferably 0.2% by weight to 10% by weight.

Developing can be carried out by rubbing with a pad containing the developer as described above or by pouring the developer onto the plate surface followed by rubbing with a brush, etc.

By developing as described above, the printing plate from which a part of the light-sensitive layer at the unexposed portion and the silicone rubber are removed, or the light-sensitive layer color formed by removal only of the silicone rubber layer is exposed, whereby a printing plate having the silicone rubber layer and the light-sensitive layer substantially without color formation remained at the exposed portion is obtained.

EXAMPLE 1

Synthesis of diazo resin 1

An amount 14.5 g (50 mmole) of p-diazodiphenylamine sulfate was dissolved under ice-cooling in 40.9 g of conc. sulfuric acid. Into the solution was added slowly 1.35 g (45 mmole) of p-formaldehyde so that the reaction temperature did not exceed 10° C.

The reaction mixture under ice-cooling was added dropwise into 500 ml of ethanol, and the precipitates formed were filtered. After washing with ethanol, the precipitates were dissolved in 100 ml of pure water, and into the solution was added a cold conc. aqueous solution containing 6.8 g of zinc chloride dissolved therein.

The precipitates formed were filtered, then washed with ethanol and this was dissolved in 150 ml of pure water. Into the solution was added cold conc. aqueous solution containing 8 g of ammonium hexafluorophosphate dissolved therein. The precipitates formed were collected by filtration, washed with water and dried to obtain a diazo resin - 1.

Preparation of aluminum plate a

An aluminum plate with a thickness of 0.24 mm was defatted by dipping in an aqueous 3% sodium hydroxide, washed with water and subjected to anodic oxidation in an aqueous 32% sulfuric acid under the conditions of a temperature of 30° C., at 5 A/dm$^2$ for 10 seconds. The plate was then washed with water, dipped in an aqueous 2% sodium metasilicate at a temperature of 85° C. for 37 seconds, further in water (pH 8.5) of 90° C. for 25 seconds, washed with water and dried to give an aluminum plate a.

The aluminum plate a was coated with a primer layer composition having the following composition, dried at 85° C. for 3 minutes and subjected to whole surface exposure of 1000 mJ/cm$^2$ by use of a 3 KW ultra-high pressure mercury lamp. Further, the coating was dried at 100° C. for 4 minutes and dried to form a primer layer with a thickness of 3.0 μm.

Primer layer composition

| | |
|---|---|
| (1) Diazo resin - 1 | 8 parts |
| (2) Copolymer resin - 1 of 2-hydroxyethyl methacrylate, methyl methacrylate with a molar ratio of 34/64 | 92 parts |
| (3) FINEX - 25 (zinc oxide pigment, manufactured by Sakai Kagaku K.K.) | 30 parts |
| (4) Methyl cellosolve | 870 parts |

Next, on the above-mentioned primer layer was coated a light-sensitive composition having the following composition, followed by drying at 100° C. for 2 minutes, to form a light-sensitive layer with a thickness of 1.2 μm.

Light-sensitive composition

| | |
|---|---|
| (1) Diazo resin - 1 | 50 parts |
| (2) Copolymer resin - 1 of 2-hydroxyethyl methacrylate, N-(4-hydroxyphenyl)-methacrylamide, methyl methacrylate, acrylonitrile with a molar ratio of 20/10/50/20 | 50 parts |
| (3) Victoria Pure Blue BOH (dye, manufactured by Hodogaya Kagaku K.K.) | 1 part |
| (5) Methyl lactate | 1900 parts |

Next, on the above-mentioned light-sensitive layer was coated the following silicone rubber composition to a dry weight of 1.8 g/m$^2$, followed by drying at 90° C. for 10 minutes.

Silicone rubber layer composition

| | |
|---|---|
| (1) Dimethylpolysiloxane having hydroxyl groups at the both ends (molecular weight: 82,000) | 100 parts |
| (2) Triacetocymethylsilane | 5 parts |
| (3) 1,3,5-Tris(trimethoxysilylpropyl) isocyanurate | 2.5 parts |
| (4) Dibutyltin laurate | 0.8 part |
| (5) Isopar E (manufactured by Esso Chemical) | 900 parts |

Next, on the above-mentioned silicone rubber layer was laminated a polypropylene film with a thickness of 5μ to obtain a water-free litho plate.

After a positive film was vacuum adhered onto the upper surface of the above-described plate material, exposure was effected by use of a metal halide lamp as the light source. Next, after dipped in the following developer - 1 for one minute, by rubbing the surface of the plate material with a pad impregnated with a developer, the silicone rubber layer at the unexposed portion was removed, whereby the dots were reproduced well to give a printing plate with the light-sensitive layer at the unexposed portion which is the image line portion being color formed in blue.

Developer - 1

| | |
|---|---|
| Benzyl alcohol | 2 parts |
| Pellex NBL (35% aqueous anionic surfactant solution, manufactured by Kao-Atlas) | 6 parts |
| Diethanolamine | 2 parts |
| 2-Hydroxy-N-(2-methylphenyl)-3-naphthoamide | 3 parts |
| Propylene glycol | 20 parts |
| Water | 67 parts |

EXAMPLE 2

A litho printing plate material requiring no dampening water was obtained in the same manner as in Example - 1 except for changing the light-sensitive composition, the silicone rubber layer composition and the developer in Example - 1 as follows.

Photosensitive composition - 2

| | |
|---|---|
| (1) Diazo resin- 1 | 15 parts |
| (2) Copolymer resin - 2 of 2-hydroxyethyl methacrylate, N-(4-hydroxyphenyl)methacrylamide, methyl methacrylate, acrylonitrile, allyl methacrylate with a molar ratio of 20/10/50/10/10 | 50 parts |
| (3) Pentaerythritol triacrylate | 15 parts |
| (4) Tetramethylomethane tetraacrylate | 20 parts |
| (5) Victoria Pure Blue BOH (dye, manufactured by Hodogaya Kagaku K.K.) | 1 part |
| (6) Kayacure DETX (2,4-Diethylthioxanthon photopolymerization initiator, manufactured by Nippon Kayaku K.K.) | 5 parts |
| (7) Kayacure EPA (p-Dimethylamino benzoic acid ethyl ester photopolymerization promotor, manufactured by Nippon Kayaku K.K.) | 2 parts |
| (8) Methyl lactate | 1900 parts |

Silicone rubber layer composition

| | |
|---|---|
| Dimethylpolysiloxane having hydroxyl groups at the both ends (molecular weight 82,000) | 100 parts |
| Triacetoxyvinylsilane | 5 parts |
| 1-Trimethoxysilylpropyl-3,5-diallyl isocyanurate | 2.5 parts |
| Dibutyltin laurate | 0.8 part |

-continued

| | |
|---|---|
| Isopar E (manufactured by Esso Chemical) | 900 parts |

Developer - 2

| | |
|---|---|
| Benzyl alcohol | 2 parts |
| Pellex NBL (aqueous 35% anionic surfactant, manufactured by Kao-Atlas) | 17 parts |
| Diethanolamine | 2 parts |
| 2-Hydroxy-N-(2-methylphenyl)-3-naphthoamide | 3 parts |
| Tripropylene glycol monomethyl ether | 45 parts |
| Isopar H (isoparaffinic solvent, manufactured by Esso Chemical K.K.) | 6 parts |
| Water | 25 parts |

Similarly as in Example - 1, the dots were well reproduced to give a printing plate with the light-sensitive layer at the unexposed portion which is the image line portion being color formed in blue.

EXAMPLE 3

A litho printing plate material requiring no dampening water was obtained in the same manner as in Example - 1 except for changing the light-sensitive composition in Example - 2 as follows.

Light-sensitive composition - 3

| | |
|---|---|
| (1) 2,5-Diethoxy-4-morpholinobenzenediazoniumfluoroborate | 15 parts |
| (2) Copolymer resin - 2 of 2-hydroxyethyl methacrylate, N-(4-hydroxyphenyl)methacrylamide, methyl methacrylate, acrylonitrile, allyl methacrylate with a molar ratio of 20/10/50/10/10 | 50 parts |
| (3) Pentaerythritol triacrylate | 15 parts |
| (4) Tetramethylolmethane tetraacrylate | 20 parts |
| (5) Victoria Pure Blue BOH (dye, manufactured by Hodogaya.Kagaku K.K.) | 1 part |
| (6) Kayacure DETX (2,4-Diethylthioxanthone photopolymerization initiator, manufactured by Nippon Kayaku K.K.) | 5 parts |
| (7) Kayacure EPA (p-Dimethylamino benzoic acid ethyl ester photopolymerization promotor, manufactured by Nippon Kayaku K.K.) | 2 parts |
| (8) Methyl lactate | 1900 parts |

The dots were reproduced well similarly as in Example - 1 to give a printing plate with the light-sensitive layer at the unexposed portion which is the image line portion being color formed in blue.

COMPARATIVE EXAMPLE 1

A litho printing plate material requiring no dampening water was obtained in the same manner as in Example - 3 except for changing 15 parts of (1) 2,3-diethoxy-4-morpholino-benzenediazoniumfluoroborate to 15 parts of the Copolymer resin - 2.

A printing plate with dots reproduced well similarly as in Example - 1 was obtained, but no color formation of the image line portion occurred, with the image after developing being indistinct, and dyeing of the image line portion with a dye solution was necessary.

EXAMPLE 4

A litho printing plate requiring no dampening water was obtained in the same manner as in Example - 1 except for changing the developer in Example - 1 as follows.

Developing solution - 3

| | |
|---|---|
| Benzyl alcohol | 2 parts |
| Pellex NBL (35% aqueous anionic surfactant, manufactured by Kao-Atlas) | 6 parts |
| Diethanolamine | 2 parts |
| N-(2-hydroxyethyl)-3,5-dihydroxybenzamide | 3 parts |
| Propylene glycol | 20 parts |
| Water | 67 parts |

The dots were reproduced well to give a printing plate with the unexposed portion which is the image line portion being color formed in red was obtained.

EXAMPLE 5

The aluminum plate a prepared in Example 1 was coated with a primer layer composition having the following composition, dried at 85° C. for 3 minutes, and then subjected to whole surface exposure of 1000 mJ/cm$^2$ by use of a 3 KW ultra-high pressure mercury lamp. Further, the coating was dried at 100° C. for 4 minutes to form a primer layer with a thickness of 3.0 μm.

Primer layer composition

| | |
|---|---|
| (1) Diazo resin - 1 | 8 parts |
| (2) Copolymer resin - 1 of 2-hydroxyethyl methacrylate and methyl methacrylate with a molar ratio of 34/64 | 92 parts |
| (3) FINEX - 25 (zinc oxide pigment, manufactured by Sakai Kagaku K.K.) | 30 parts |
| (4) Methyl cellosolve | 870 parts |

Next, on the above-mentioned primer layer was coated a light-sensitive composition having the composition, followed by drying at 100° C. for 2 minutes, to form a light-sensitive layer with a thickness of 1.2 μm.

Light-sensitive composition

| | |
|---|---|
| (1) Diazo resin - 1 | 50 parts |
| (2) Copolymer resin - 1 of 2-hydroxyethyl methacrylate, N-(4-hydroxyphenyl)methacrylamide, methyl methacrylate, acrylonitrile with a molar ratio of 20/10/50/20 | 50 parts |
| (3) Victoria Pure Blue BOH (dye, manufactured by Hodogaya Kagaku K.K.) | 1 part |
| (4) 2-Hydroxy-N-(2-methylphenyl)-3 naphtoamide | 15 parts |
| (5) Methyl lactate | 1900 parts |

Next, on the above-mentioned light-sensitive layer was coated the following silicone rubber composition to a dry weight of 1.8 g/m$^2$, followed by drying at 90° C. for 10 minutes.

Silicone rubber layer composition

| | |
|---|---|
| (1) Dimethylpolysiloxane having hydroxyl groups at both ends (molecular weight 82,000) | 100 parts |
| (2) Triacetoxymethylsilane | 5 parts |
| (3) 1,3,5-Tris(trimethoxysilylpropyl) isocyanurate | 2.5 parts |
| (4) Dibutyltin laurate | 0.8 part |
| (5) Isopar E (manufactured by Esso Chemical) | 900 parts |

Next, on the above-mentioned silicone rubber layer was laminated a polypropylene film with a thickness of 5μ to give a litho printing plate requiring no dampening water.

After a positive film was vacuum adhered onto the upper surface of the above-mentioned plate material, exposure was effected by use of a metal halide lamp as the light source. Next, the plate material was dipped in the following developer - 1, and then the surface of the plate material was rubbed with a pad impregnated with the developer to remove the silicone rubber layer at the unexposed portion, whereby the dots were well reproduced to obtain a printing plate with the light-sensitive layer at the unexposed portion which is the image line portion being color formed in blue.

Developer - 4

| | |
|---|---|
| Benzyl alcohol | 2 parts |
| Pellex NBL (35% aqueous anionic surfactant, manufactured by Kao-Atlas) | 6 parts |
| Diethanolamine | 2 parts |
| Propylene glycol | 20 parts |
| Water | 67 parts |

EXAMPLE 6

A printing plate material requiring no dampening water was obtained in the same manner as in Example - 1 except for changing the light-sensitive composition, the silicone rubber layer composition, and the developer as follows.

Light-sensitive composition - 2

| | |
|---|---|
| (1) Diazo resin - 1 | 15 parts |
| (2) Copolymer resin - 2 of 2-hydroxyethyl methacrylate, N-(4-hydroxyphenyl)methacrylamide, methyl methacrylate, acrylonitrile, allyl methacrylate with a molar ratio of 20/10/50/10/10 | 50 parts |
| (3) Pentaerythritol triacrylate | 15 parts |
| (4) Tetramethylolmethane tetraacrylate | 20 parts |
| (5) Victoria Pure Blue BOH (dye, manufactured by Hodogaya Kagaku K.K.) | 1 part |
| (6) Kayacure DETX (2,4-Diethylthioxanthone photopolymerization initiator, manufactured by Nippon Kayaku K.K.) | 5 parts |
| (7) Kayacure EPA (p-Dimethylamino benzoic acid ethyl ester photopolymerization promotor, manufactured by Nippon Kayaku K.K.) | 2 parts |
| (8) 2-Hydroxy-N-(2-methylphenyl)-3-naphthoamide | 15 parts |
| (9) Methyl lactate | 1900 parts |

Silicone rubber layer composition

| | |
|---|---|
| Dimethylpolysiloxane having hydroxyl groups at both ends (molecular weight 82,000) | 100 parts |
| Triacetoxyvinylsilane | 5 parts |
| 1-Trimethoxysilylpropyl-3,5-diallyl-isocyanurate | 2.5 parts |
| Dibutyltin laurate | 0.8 part |
| Isopar E (manufactured by Esso Chemical) | 900 parts |

Developer - 5

| | |
|---|---|
| Benzyl alcohol | 2 parts |
| Pellex NBL (35% aqueous anionic surfactant, manufactured by Kao-Atlas) | 17 parts |
| Diethanolamine | 2 parts |
| Tripropylene glycol monomethyl ether | 45 parts |
| Isopar H (isoparaffinic solvent, manufactured by Esso Chemical K.K.) | 6 parts |
| Water | 25 parts |

The dots were reproduced well similarly as in Example - 1 to give a printing plate with the light-sensitive layer at the unexposed portion which is in the image line portion being color formed in blue.

EXAMPLE - 7

A litho printing plate material requiring no dampening water was obtained similarly as in Example - 1 except for changing the light-sensitive composition of Example - 2 as follows.

Photosensitive composition

| | |
|---|---|
| (1) 2,5-Diethoxy-4-morpholinobenzene-diazoniumfluoroborate | 15 parts |
| (2) Copolymer resin - 2 of 2-hydroxyethyl methacrylate, N-(4-hydroxyphenyl)methacrylamide, methyl methacrylate, acrylonitrile, allyl methacrylate with a molar ratio of 20/10/50/10/10 | 50 parts |
| (3) Pentaerythritol triacrylate | 15 parts |
| (4) Tetramethylolmethane tetraacrylate | 20 parts |
| (5) Victoria Pure Blue BOH (dye, manufactured by Hodogaya Kagaku K.K.) | 1 part |
| (6) Kayacure DETX (2,4-Diethylthioxanthone photopolymerization initiator, manufactured by Nippon Kayaku K.K.) | 5 parts |
| (7) Kayacure EPA (p-Dimethylamino benzoic acid ethyl ester photopolymerization promotor, manufactured by Nippon Kayaku K.K.) | 2 parts |
| (8) 2-Hydroxy-N-(2-methylphenyl)-3-naphthoamide | 15 parts |
| (9) Methyl lactate | 1900 parts |

The dots were well reproduced similarly as in Example - 1 to give a printing plate with the light-sensitive layer at the unexposed portion which the image line portion being color formed in blue.

EXAMPLE 8

A litho printing plate requiring no dampening water was obtained in the same manner as in Example - 5 except for changing (4) in the light-sensitive composition of Example - 1 to that shown below.

| | |
|---|---|
| (4) N-(2-hydroxyethyl)-3,5-dihydroxybenzamide | 15 parts |

When exposed and developed similarly as in Example 1, dots were well reproduced to give a printing plate with the light-sensitive layer at the unexposed portion which is the image line portion being color formed in red.

EXAMPLE 9

After exposure of the litho printing plate material requiring no dampening was obtained in Example 5, developing was carried out with the developer - 6 shown below similarly as in Example - 5. Subsequently, the plate material was dipped in the processing solution - 1 shown below for one minute. The dots were well reproduced similarly as in Example - 5 to give a printing plate with the unexposed portion which is the image line portion being color formed in blue.

Developer - 6

| Benzyl alcohol | 2 parts |
|---|---|
| Pellex NBL | 6 parts |
| Propylene glycol | 22 parts |
| Water | 70 parts |

Processing solution - 1

| Monoethanolamine | 3 parts |
|---|---|
| Water | 97 parts |

The image line portion at this time was not color formed during developing, and color formed for the first time when processed with the processing solution - 1.

The present invention, by containing at least one of color forming substances and couplers in the light-sensitive layer, and effecting color formation through the component in the processing solution, can exhibit the excellent effects of sharp images after developing and no contamination of hands and clothings with the dyeing solution after developing and contamination of automatic developing machine.

We claim:

1. A light-sensitive litho printing plate comprising: a support, a light-sensitive layer, a silicone rubber layer provided thereon and a primer layer containing a diazo light-sensitive composition provided between said support and said light-sensitive layer which is cured by heating or exposure prior to coating of the light-sensitive layer, wherein said light-sensitive layer contains a substance in admixture with a photopolymerizable compound, whereby said substance forms a color through a reaction with a coupler during developing or after developing said light-sensitive litho printing plate, wherein said substance is a diazo resin present in an amount of 10% by weight to 90% by weight and represented by Formula III:

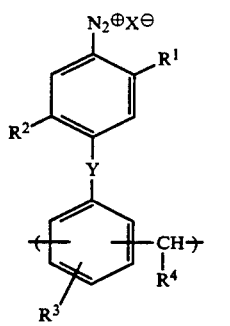

III wherein $R^1$, $R^2$ and $R^3$ are hydrogen, an alkyl group or an alkoxy group, $R^4$ is hydrogen, an alkyl group or a phenyl group, X is an anion and Y is —NH—, —S— or —O—;

or a diazo compound present in an amount of 5% by weight to 45% by weight and selected from the group consisting of:

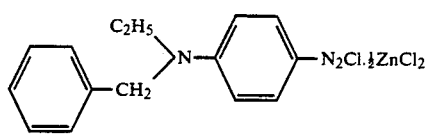 1.

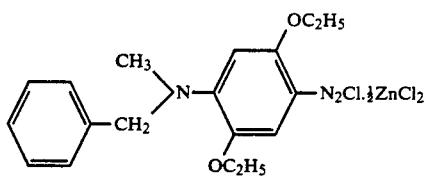 2.

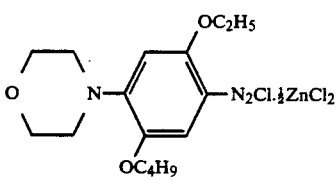 3.

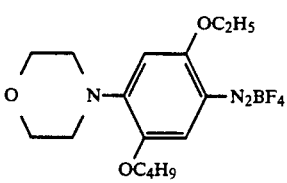 4.

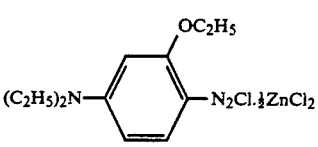 5.

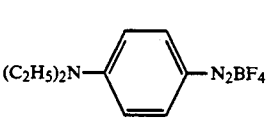 6.

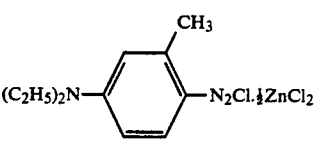 7.

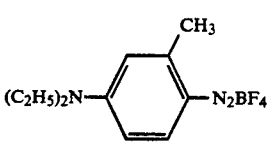 8.

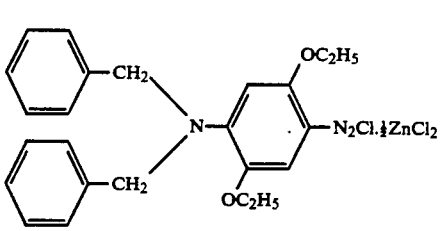 9.

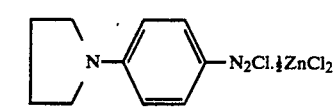 10.

and

-continued

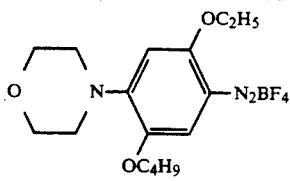

wherein said light-sensitive layer has admixed therein 0.2% by weight to 40% by weight of a coupler selected from 2-hydroxy-N-(2-methylphenyl)-3-naphthoamide and N-(2-hydroxyethyl)-3,5-dihydroxybenzamide, wherein said silicone rubber layer is the linear organic polysiloxane represented by formula I:

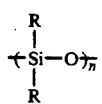

wherein n is an integer of 2 or more, and R is an alkyl group having 1 to 10 carbon atoms, a halogenated alkyl group, an alkoxy group, a vinyl group, an aryl group or a silanol group.

2. The printing plate of claim 1 wherein said developing is carried out by a processing solution.

3. The printing plate of claim 2 wherein said processing solution contains a coupler.

4. The printing plate of claim 3 wherein the content of said coupler is 0.1% by weight to 20% by weight to said processing solution when said coupler is contained in said processing solution.

5. The printing plate of claim 4 wherein the content of said coupler is 1% by weight to 10% by weight to said processing solution.

6. The printing plate of claim 1 wherein the content of said coupler is 1% by weight to 30% by weight in the solids of the light-sensitive component.

7. The printing plate of claim 1, wherein said diazo resin is present in said substance in an amount of 30% by weight to 70% by weight.

8. The printing plate of claim 1, wherein said diazo compound is present in said substance in an amount of 10% by weight to 30% of weight.

9. The printing plate of claim 1 wherein said silicone rubber is the compound obtained by condensing said polysiloxane and a silane compound represented by following formula: $R_nSiX_{4-n}$ (wherein n is an integer of 1 to 3, R is a monovalent group such as an alkyl, aryl, alkenyl or the combination of these, and these groups have functional groups such as halogen, amine, hydroxyl, alkoxy, aryloxy and thiol, X represents —OH, $OR^2$, —OAc,

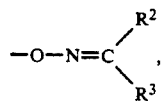

Cl, —Br and —I (wherein $R^2$ and $R^3$ represent the same as the above R, and $R^2$, $R^3$ may be either the same or different.

10. The printing plate of claim 1 wherein said anion is the anion of hexafluorophosphoric acid.

* * * * *